United States Patent
Kaneko (10) Patent No.: US 7,838,394 B2
(45) Date of Patent: Nov. 23, 2010

(54) METHOD OF MANUFACTURING SEMICONDUCTOR DEVICE

(75) Inventor: Norihiko Kaneko, Fussa (JP)

(73) Assignee: Casio Computer Co., Ltd., Tokyo (JP)

( * ) Notice: Subject to any disclaimer, the term of this patent is extended or adjusted under 35 U.S.C. 154(b) by 716 days.

(21) Appl. No.: 11/706,772

(22) Filed: Feb. 15, 2007

(65) Prior Publication Data

US 2007/0190689 A1    Aug. 16, 2007

(30) Foreign Application Priority Data

Feb. 16, 2006   (JP) .............................. 2006-039134

(51) Int. Cl.
*H01L 21/00* (2006.01)

(52) U.S. Cl. ................ 438/460; 438/108; 257/E21.599

(58) Field of Classification Search ................ 438/460, 438/108; 257/738, E21.599, E23.021, E23.105
See application file for complete search history.

(56) References Cited

U.S. PATENT DOCUMENTS

2004/0207082 A1 * 10/2004 Yamano et al. ............. 257/738

FOREIGN PATENT DOCUMENTS

JP   2001-332643   11/2001

* cited by examiner

*Primary Examiner*—Alexander G Ghyka
*Assistant Examiner*—Abdulfattah Mustapha
(74) *Attorney, Agent, or Firm*—Holtz, Holtz, Goodman & Chick, PC

(57) ABSTRACT

A semiconductor substrate in a wafer state having one surface provided thereon a plurality of external connection electrodes is stacked onto a support film. The wafer-state semiconductor substrate stuck on the support film is cut into a plurality of chip size semiconductor substrates, whereby the adjacent semiconductor substrates are separated from each other, and each semiconductor substrate is provided with at least one of the external connection electrodes. At least one protection film is formed on the other surface of the chip size semiconductor substrates, and on a peripheral side surface thereof that the chip size semiconductor substrates, which are adjacent to each other, are separated from each other.

10 Claims, 8 Drawing Sheets

METHOD OF MANUFACTURING SEMICONDUCTOR DEVICE

CROSS-REFERENCE TO RELATED APPLICATIONS

This application is based upon and claims the benefit of priority from prior Japanese Patent Application No. 2006-039134, filed Feb. 16, 2006, the entire contents of which are incorporated herein by reference.

BACKGROUND OF THE INVENTION

1. Field of the Invention

The present invention relates to a method of manufacturing semiconductor devices.

2. Description of the Related Art

There is known a conventional method of manufacturing semiconductor devices. In the method, to enhance the protection against environmental matters of dust, humidity, mechanical destruction, etc., a first protection film is formed on a reverse surface of a semiconductor substrate in a wafer state of which the obverse surface includes integrated circuits and connection pads connected to each of the integrated circuits. Then, the semiconductor substrate in the wafer state, which includes the first protection film, is separated into individual semiconductor substrates by cutting in a state that the first protection film is stacked on the upper surface of the first film. Further, the first protection films provided on the reverse surface of the plurality of separated semiconductor substrates are stacked on and re-arrayed on the upper surface of a second film. In this state, a second protection film is formed covering the obverse surfaces and the peripheral side surfaces of the individual semiconductor substrates including the first protection films (Jpn. Pat. Appln. KOKAI Publication No. 2001-332643).

The conventional method of manufacturing the semiconductor device needs two separate steps, a first step for forming the first protection film on the reverse surface of the wafer-state semiconductor substrate, and a second step for forming the second protection film covering the peripheral side surfaces of the individual semiconductor substrates, including the first protection films. That is to say, this conventional semiconductor device manufacturing method needs an additional step for the manufacturing of the semiconductor devices.

BRIEF SUMMARY OF THE INVENTION

Therefore, an object of the present invention is to provide a method of manufacturing a semiconductor device which reduces the number of steps for forming the protection film to protect the reverse surfaces and the peripheral side surfaces of the semiconductor substrates.

In order to achieve the above-described object, according to one aspect of the present invention, there is provided a method of manufacturing a semiconductor device comprising:

stacking a first surface of a semiconductor substrate in a wafer state provided with a plurality of external connection electrodes thereon, onto a first surface of a support film;

cutting the wafer-state semiconductor substrate stacked on the first surface of the film into a plurality of chip size semiconductor substrates, whereby the chip size semiconductor substrates adjacent to each other are separated from each other, and said each chip size semiconductor substrate is provided with at least one of the external connection electrodes; and forming at least one protection film on a second surface of each of the chip size semiconductor substrates, which is opposite to the first surface thereof, and on a peripheral side surface thereof in a state that said plurality of chip size semiconductor substrates, which are adjacent to each other, are separated from each other.

In order to achieve the above-described object, according to another aspect of the present invention, there is provided a method of manufacturing a semiconductor device comprising:

stacking a first surface of a wafer-state semiconductor substrate provided with a plurality of external connection electrodes thereon, onto a first surface of a support film;

cutting the wafer-state semiconductor substrate stacked on the first surface of the support film into a plurality of chip size semiconductor substrates, whereby the chip size semiconductor substrates adjacent to each other are separated from each other, and each of the separated chip size semiconductor substrates is provided with at least one of the external connection electrodes;

expanding the support film in a plane direction to increase a distance between said plurality of separated chip size semiconductor substrates being adjacent to each other; and forming at least one protection film, over the entire clearance between said plurality of separated chip size semiconductor substrates being adjacent to each other, on a second surface of each of the chip size semiconductor substrates, which is opposite to the first surface thereof, and on a peripheral side surface thereof in a state that said plurality of chip size semiconductor substrates, which are adjacent to each other, are separated from each other.

In order to achieve the above-described object, according to still another aspect of the present invention, there is provided a method of manufacturing a semiconductor device comprising:

stacking a first surface of a wafer-state semiconductor substrate provided a plurality of columnar electrodes thereon, onto a first surface of a support film;

providing at least one sealing film on and around the columnar electrodes;

cutting the wafer-state semiconductor substrate stacked on the first surface of the support film, and separating said at least one sealing film, together with the wafer-state semiconductor substrate, into a plurality of chip size semiconductor substrates, whereby the chip size semiconductor substrates adjacent to each other are separated from each other, and each of the chip size semiconductor substrates is provided with at least one of the external connection electrodes;

expanding the support film to increase a distance between said plurality of separated chip size semiconductor substrates being adjacent to each other; and forming at least one protection film, over the entire clearance between said plurality of separated chip size semiconductor substrates being adjacent to each other, on a second surface of said each chip size semiconductor substrate, which is opposite to the first surface thereof, on a peripheral side surface thereof, and on the peripheral side surfaces of said plurality of separated sealing films in a state that said plurality of chip size semiconductor substrates, which are adjacent to each other, are separated from each other. According to the invention, the wafer-state semiconductor substrate which is stacked on the first surface of the support of dicing film is cut into a plurality of chip size semiconductor substrates, whereby the chip size semiconductor substrates adjacent to each other but separated from each other are formed. Said at least one protection film is formed on the second surface (reverse surface) of each of the chip size semiconductor substrates which is opposite to the first surface thereof, and on the peripheral side surface of each chip size semiconductor substrate, in a state that the chip size semiconductor substrates, which are adjacent to each other, are separated from each other. Therefore, the number of the steps to form at least one protection film is reduced when compared to the case using the step of forming the protection film on the reverse side and another step of forming the protection film on the peripheral side surface.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
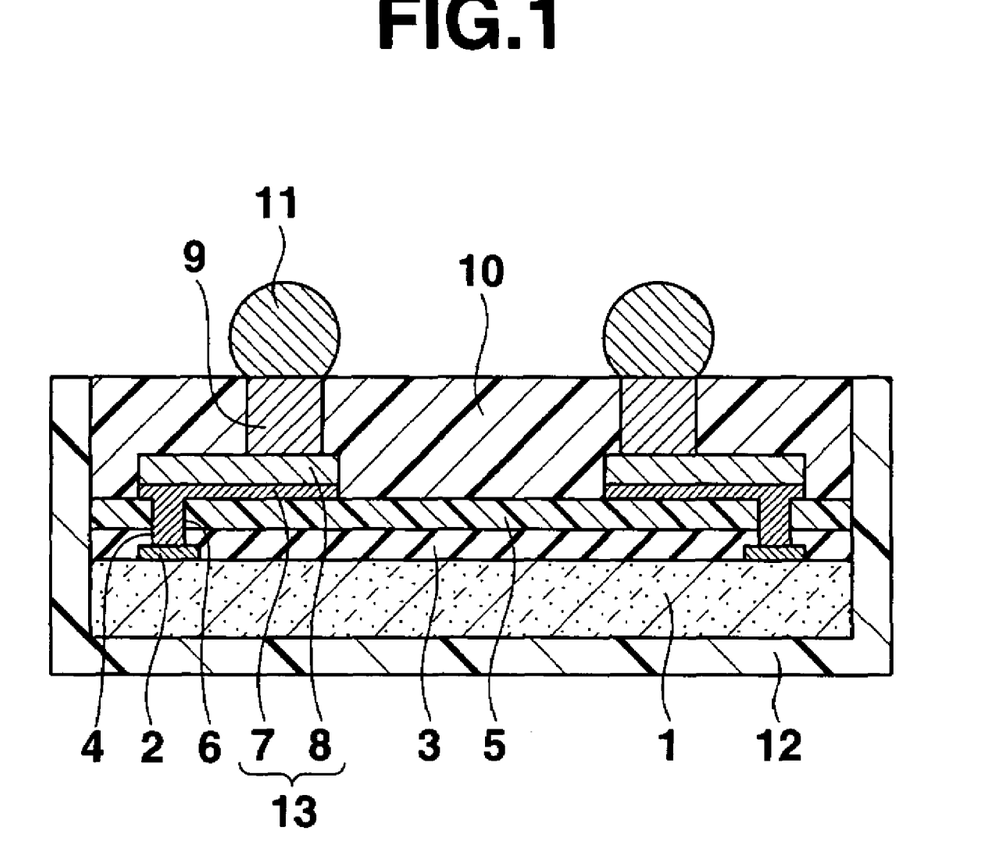
FIG. 1 is a cross sectional view showing an example of a semiconductor device manufactured by a semiconductor device manufacturing method of an embodiment according to the present invention.

FIG. 1 is a cross sectional view showing an example of a semiconductor device manufactured by a semiconductor device manufacturing method of an embodiment according to the invention. The semiconductor device, generally called a CSP (chip size package), includes a silicon substrate (semiconductor substrate) 1. An integrated circuit (not shown) having a given function is provided on the upper surface (obverse surface) of the silicon substrate 1. A plurality of connection pads 2 made of aluminum-based metal are formed on a peripheral part of the upper surface of the silicon substrate, and electrically connected to the integrated circuit.

An insulating film 3 made of silicon oxide is provided on upper surfaces of the connection pads 2 except the central parts thereof and the upper surface of the silicon substrate 1. The central parts of the connection pads 2 are exposed through openings 4 formed in the insulating film 3. A protection film 5 made of polyimide resin or the like is formed on the upper surface of the insulating film 3. Through openings 6 are formed in the protection film 5 at positions of the insulating film 3 corresponding to the openings 4.

Base metal layers 7 made of copper or the like are provided on the upper surface of the protection film 5. An upper metal layer 8 made of copper is provided on the entire surface of each of the base metal layers 7. The base metal layer 7 and the upper metal layer 8 cooperate to form a wire 13. One end of the wire 13 is connected to the connection pad 2 through the openings 4 and 6 of the insulating film 3 and the protection film 5. A columnar electrode (electrode for external connection) 9 made of copper is provided on the upper surface of the wire 13, i.e., the other end of the upper metal layer 8. A part where the columnar electrode 9 is provided is called a connection pad part of the upper metal layer 8.

A sealing film 10 made of resin such as epoxy resin or the like is provided on the upper surface of the upper metal layers 8 except the connection pad parts and the upper surface of the protection film 5 in a state that the sealing film 10 is flush with the upper surfaces of the columnar electrodes 9. Solder balls 11 are provided on the top surfaces of the columnar electrodes 9, respectively. A protection film 12 made of resin such as epoxy resin or the like is provided on the peripheral side surfaces of the silicon substrate 1, the insulating film 3, the protection film 5 and the sealing film 10, and the lower surface (reverse surface) of the silicon substrate 1, which is opposite to the upper surface thereof provided with the columnar electrodes 9.

(First Manufacturing Method)

Figure 2:
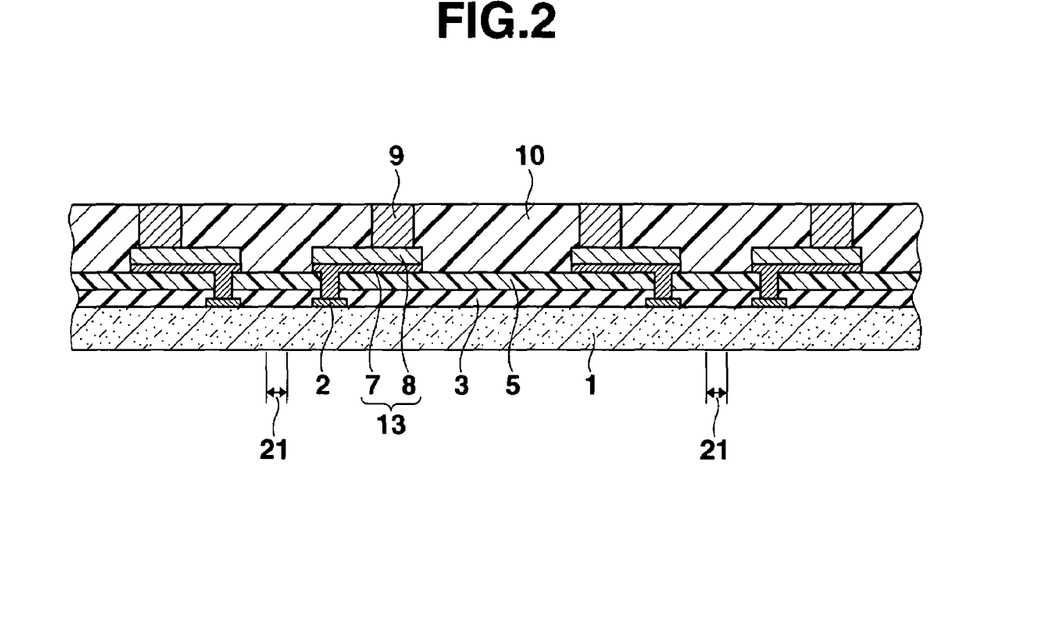
FIG. 2 is a cross sectional view showing a wafer-state semiconductor substrate prepared for execution of a first method of manufacturing the semiconductor device as shown in FIG. 1.

A first method of manufacturing the semiconductor device mentioned above will now be described. To start, an assembly is prepared in which a plurality of groups of connection pads 2, the insulating film 3, the protection film 5, a plurality of groups of base metal layers 7, the upper metal layers 8, the columnar electrodes 9 and the sealing film 10 are formed on the wafer-state silicon substrate 1, but the solder balls 11 are not formed. In FIG. 2, regions designated by reference numeral 21 are regions corresponding to dicing streets.

Figure 3:
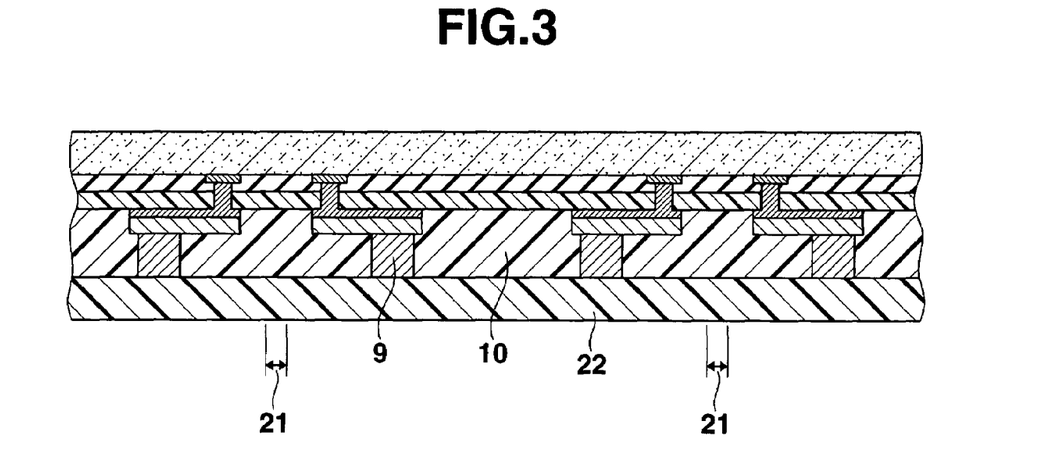
FIG. 3 is a cross sectional view showing the semiconductor substrate for explaining a process step following the process step shown FIG. 2.
Figure 4:
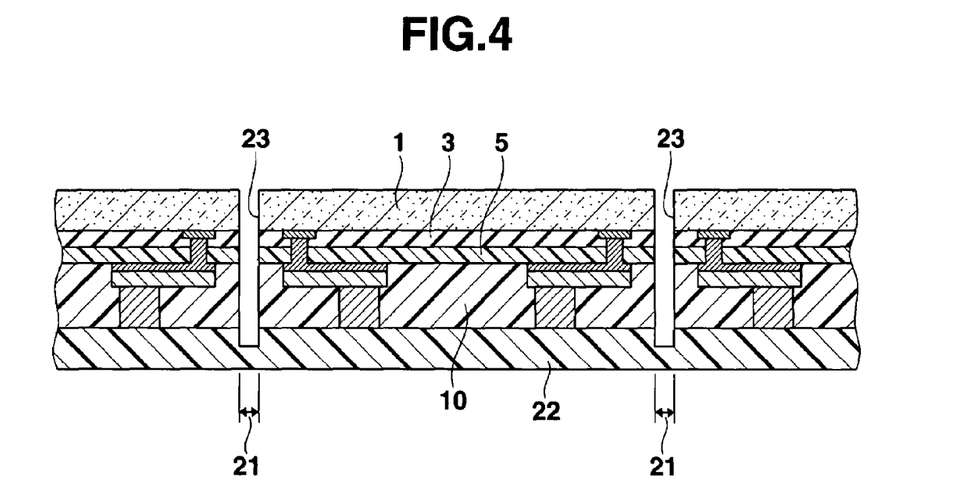
FIG. 4 is a cross sectional view showing the semiconductor substrate for explaining a process step following the process step shown FIG. 3.

The assembly shown in FIG. 2 is turned upside down, and as shown in FIG. 3, the lower or first surfaces of the columnar electrodes 9 and the lower surface of the sealing film 10 are stacked on the upper or first surface of a first dicing or support film 22, which is extensible or expandable in a plane direction. Subsequently, as shown in FIG. 4, the silicon substrate 1, the insulating film 3, the protection film 5 and the sealing film 10 are cut along the dicing streets 21 by the dicing method, the laser-cutting method or the like. As a result, the silicon substrate 1 in a wafer state is cut into a plurality of silicon substrates 1 of chip size (chip size semiconductor substrate), which are separated from on another with clearances each existing between the adjacent ones.

In a first step of the cutting process, the cutting progresses from the silicon substrate 1 located on the upper side downward and reaches the middle of the first dicing film 22 as viewed in the thickness direction. As a result, the wafer-state silicon substrate 1 is separated into individual chips. Since the lower surfaces of those chips have been stacked on the first dicing film 22, grooves 23 are formed in the recessed parts formed in the first dicing film 22 and the regions between the adjacent chips, or corresponding to the dicing streets 21.

Figure 5:
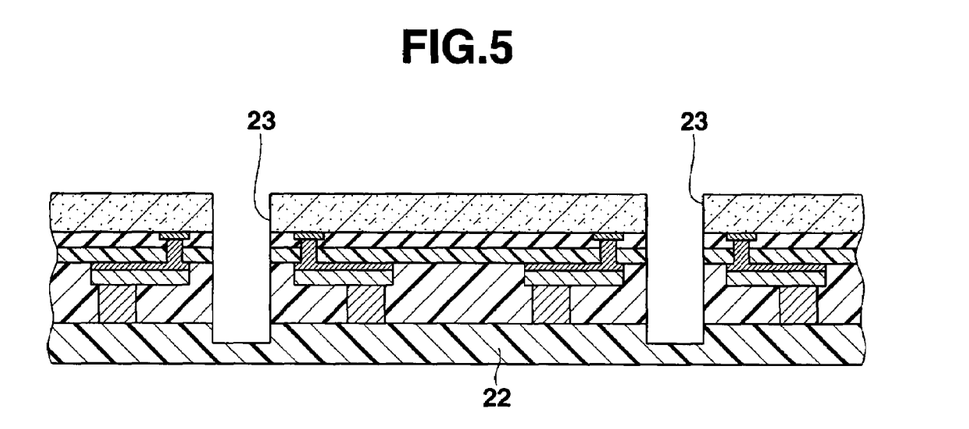
FIG. 5 is a cross sectional view showing the semiconductor substrate for explaining a process step following the process step shown FIG. 4.

In the next step, as shown in FIG. 5, the first dicing film 22 is pulled to its peripheral side or x and y directions to be expanded, so that the width of each groove 23, i.e., the clearance between the adjacent chips (distance the adjacent chips move away from each other), is widened by an amount of the expansion. In the subsequent step, the protection film 12 made of epoxy resin is formed, by the spin coating method or the like, on the entire inner surfaces of the grooves 23 and the entire upper or second surface of the silicon substrate 1 such that the upper surface of the protection film is flat.

In this state, the peripheral surface of the silicon substrate 1, the insulating film 3, the protection film 5, and the sealing film 10 of each semiconductor device are covered with the protection film 12 formed on the inner surfaces of the grooves 23. The protection film 12 is made of epoxy resin in this instant embodiment, but it may be made of any of acrylic resin, urethane resin, polyimide resin, polyamide resin and inorganic or organic water glass instead.

Figure 6:
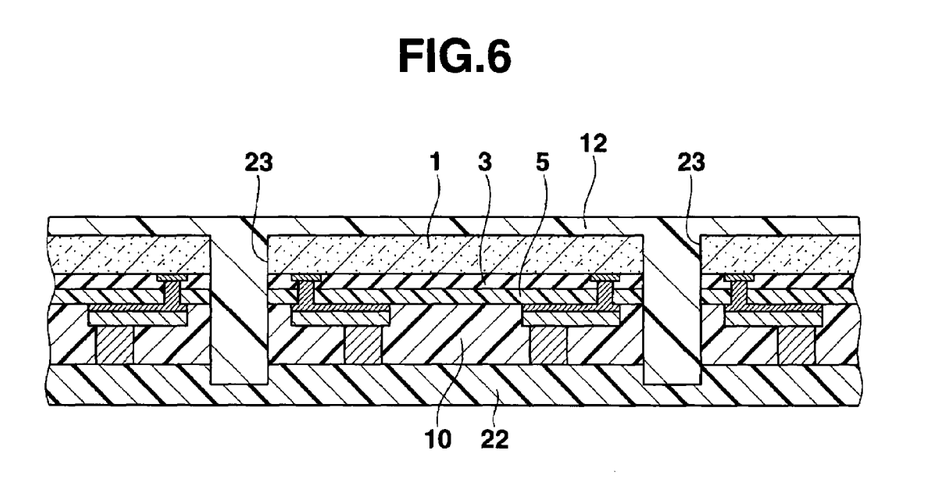
FIG. 6 is a cross sectional view showing the semiconductor substrate for explaining a process step following the process step shown FIG. 5.
Figure 7:
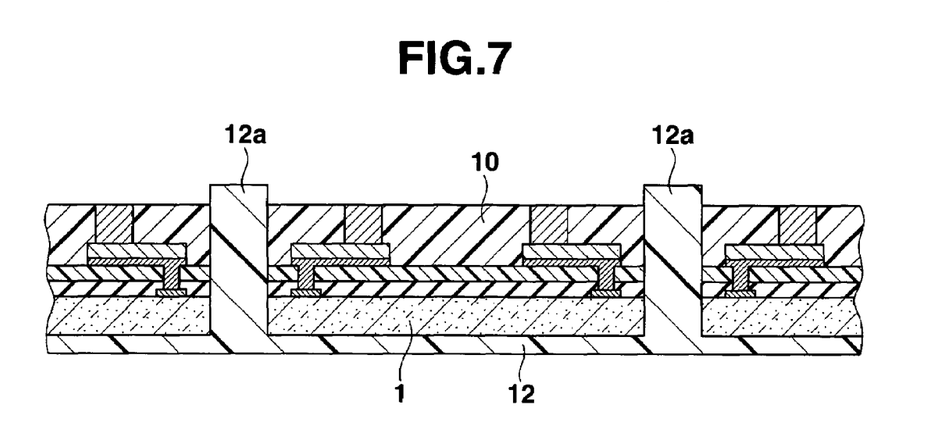
FIG. 7 is a cross sectional view showing the semiconductor substrate for explaining a process step following the process step shown FIG. 6.
Figure 8:
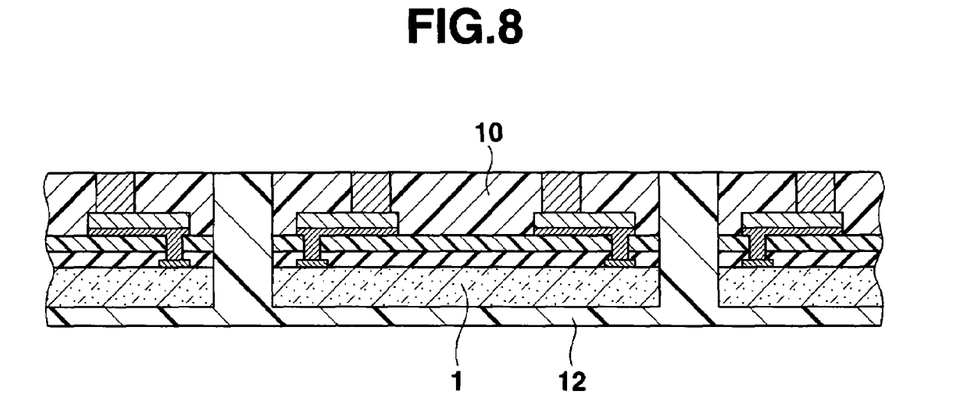
FIG. 8 is a cross sectional view showing the semiconductor substrate for explaining a process step following the process step shown FIG. 7.

Then, the assembly shown in FIG. 6 is turned upside down, and the first dicing film 22 is peeled off to expose the upper surface of the assembly as shown in FIG. 7. In this state, the protection film 12 covers or fills the clearances each between the adjacent chips and covers the lower surface of the silicon substrate 1, whereby the plurality of chips are integrated into a single unit. The parts, designated by reference numeral 12a, of the protection film 12 formed in the grooves 23, which extend into the first dicing film 22 shown in FIG. 6, are protruded from the upper surface of the sealing film 10. Subsequently, the protrusions 12a are removed by polishing so that the upper surfaces of the protection film 12 each between the adjacent chips are flush with the upper surface of the sealing film 10 as shown in FIG. 8.

Figure 9:
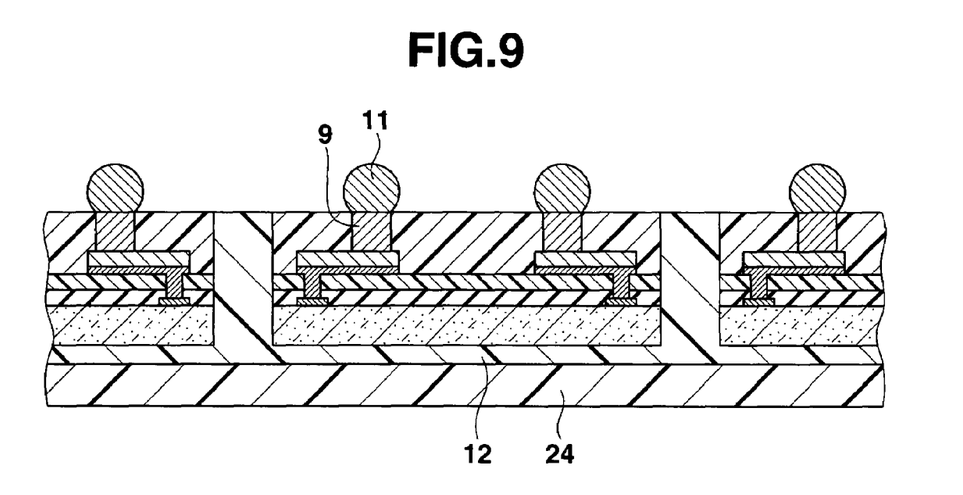
FIG. 9 is a cross sectional view showing the semiconductor substrate for explaining a process step following the process step shown FIG. 8.
Figure 10:
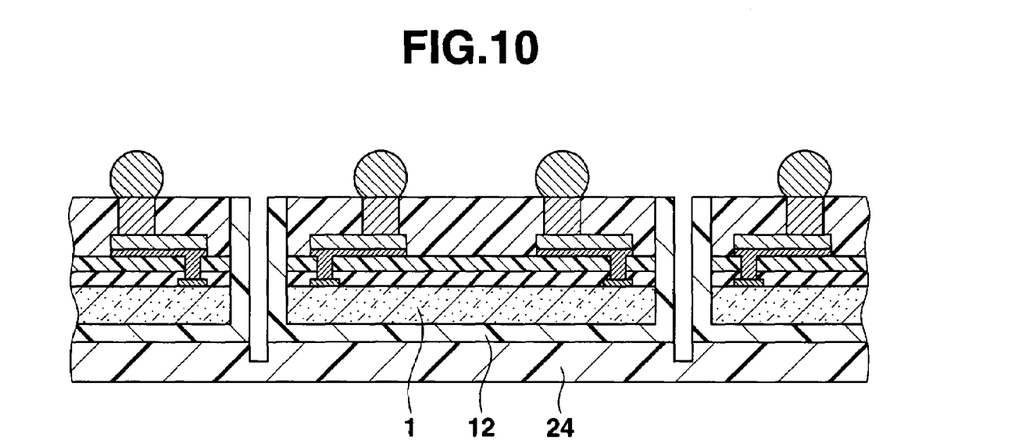
FIG. 10 is a cross sectional view showing the semiconductor substrate for explaining a process step following the process step shown FIG. 9.

Solder or conductive balls 11 are then formed on the top surfaces of the columnar electrodes 9 as shown in FIG. 9. Thereafter, the lower surface of the protection film 12 is stuck on the upper surface of the second dicing film 24. Then, the central parts of the protection film 12 formed in the clearances each between the adjacent chips as viewed in the width direction are cut out as shown in FIG. 10 by the dicing method, the laser-cutting method or the like. Subsequently, the silicon substrate 1 including the protection film 12 and the like is peeled off from the second dicing film 24, whereby a plurality of semiconductor devices shown in FIG. 1 are manufactured.

As described above, in the method of manufacturing semiconductor devices, as shown in FIG. 4, the silicon substrate 1 in a wafer state and the like are cut and separated into chips in a state that the sealing film 10 and the like provided on the lower side (obverse surface side) of the wafer-state silicon substrate 1 are stacked on the upper surface of the first dicing film 22. Then, as shown in FIG. 6, the protection film 12 is simultaneously formed on the upper surface (reverse surface) of the silicon substrate 1, which is opposite to the lower surface thereof provided with the columnar electrodes 9, and the peripheral side surfaces thereof in a state that the first dicing film 22 is pulled to the peripheral side to increase the width of the grooves 23, i.e., the clearance between the adjacent chips (distance between the adjacent chips). Therefore, the number of the steps to form the protection film 12 is reduced when compared to the case using the step of forming the protection film on the reverse side and another step of forming the protection film on the peripheral side surface.

In the method of manufacturing semiconductor devices, which is described in Jpn. Pat. Appln. KOKAI Publication No. 2001-332643, the wafer-state semiconductor substrate including the first protection film is cut and separated into individual semiconductor substrates in a state that the first protection film is stacked on the upper surface of the first film, and the first protection film provided on the reverse surfaces of a plurality of separated semiconductor substrates are stacked on the upper surface of the second film to be re-arrayed. Therefore, it is very difficult to re-array the separated semiconductor substrates including the first protection films.

On the other hand, in the above-described semiconductor device manufacturing method, as shown in FIG. 4, the wafer-state silicon substrate 1 and the like are cut and separated into chips in a state that the lower side of the wafer-state silicon substrate 1 is stacked on the upper surface of the first dicing film 22. Then, as shown in FIG. 6, the protection film 12 is formed on the upper surface of the silicon substrate 1 and the peripheral side surfaces thereof in a state that the first dicing film 22 is pulled to the peripheral side to increase the chip-to-chip distance. Therefore, there is no need of re-arraying the separated silicon substrates 1 and the like.

In this case, if the wafer-state silicon substrate is diced by using a wide blade so that the grooves 23 each between the adjacent silicon substrates 1 shown in FIG. 4 are increased to have the wide width as shown in FIG. 5, there is no need of expanding the first dicing film 22 to the peripheral side. As a result, the semiconductor device manufacturing process is further enhanced in efficiency.

(Second Manufacturing Method)

Figure 11:
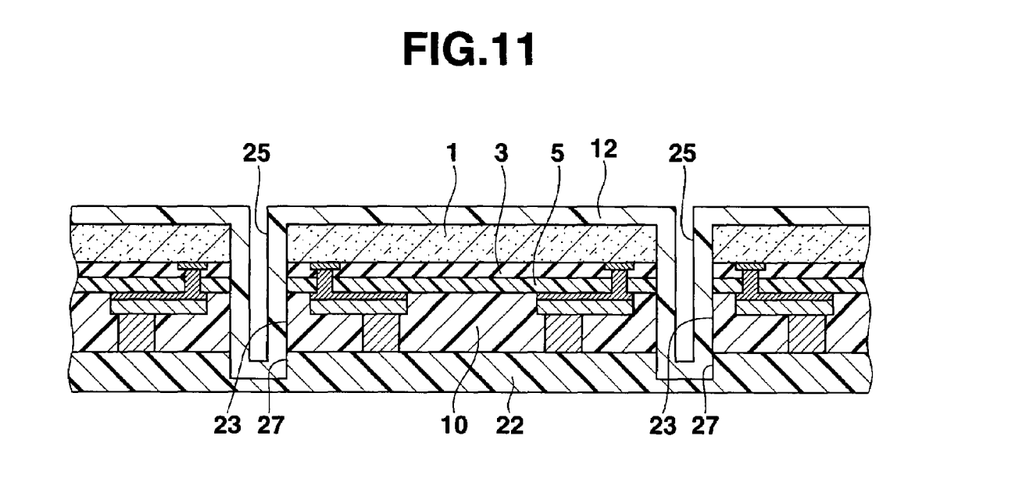
FIG. 11 is a cross sectional view showing a predetermined process step of a second method of manufacturing the semiconductor device as shown in FIG. 1.

A second method of manufacturing the semiconductor device shown in FIG. 1 will now be described. In the second method, following the step showing FIG. 5, a protection film 12 made of epoxy resin, as shown in FIG. 11, is formed on the peripheral side surfaces of the silicon substrate 1, the insulating film 3, the protection film 5, and the sealing film 10, which are surrounded or exposed by the grooves 23, the bottom surface and the inner side surface of the recesses 27 formed in the first dicing film 22, and the upper surface of the silicon substrate 1, by the spray coating method. Then, grooves 25 are respectively formed in the central parts in the width direction of the portions of the protection film 12 formed in the grooves 23. A thickness of the protection film 12 is selected to be equal to or smaller than a depth of each of the recesses 27. In the instant embodiment, a thickness of the protection film 12 is smaller than a depth of each of the recesses 27 as seen from the figure.

Figure 12:
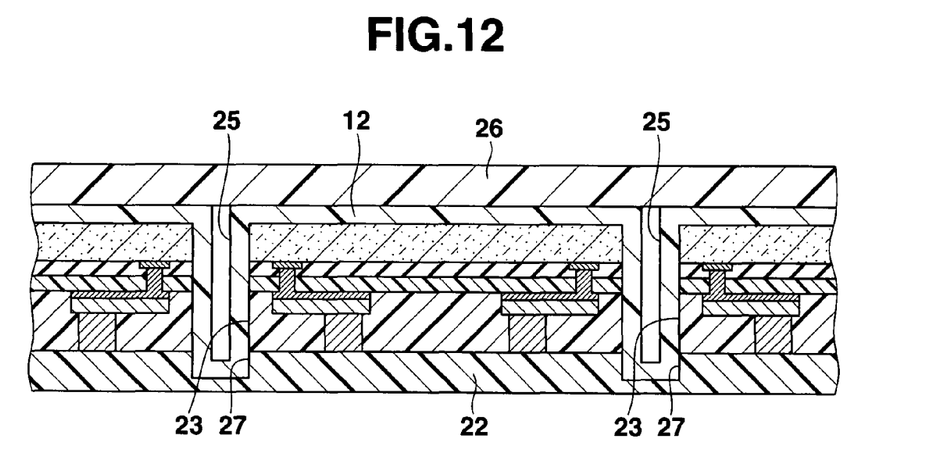
FIG. 12 is a cross sectional view showing the semiconductor substrate for explaining a process step following the process step shown FIG. 11.
Figure 13:
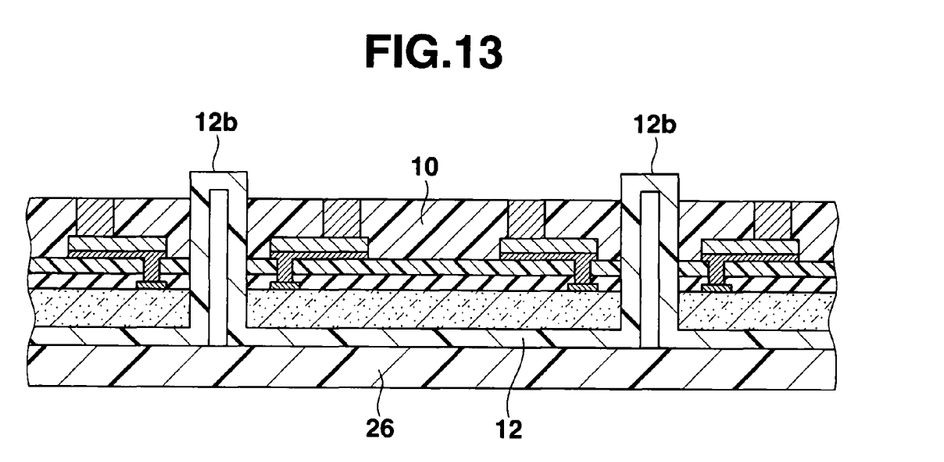
FIG. 13 is a cross sectional view showing the semiconductor substrate for explaining a process step following the process step shown FIG. 12.
Figure 14:
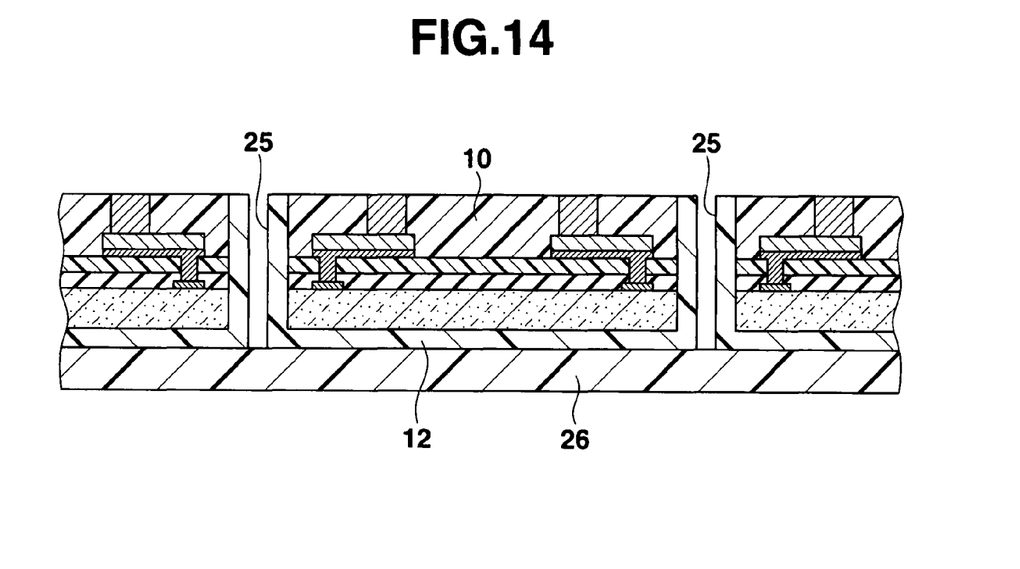
FIG. 14 is a cross sectional view showing the semiconductor substrate for explaining a process step following the process step shown FIG. 13.

Subsequently, as shown in FIG. 12, a support film 26 is stacked on the upper surface of the protection film 12 placed on the silicon substrate 1. In the next step, the assembly shown in FIG. 12 is turned upside down, and the first dicing film 22 is then peeled off to be as shown in FIG. 13. In this state, portions 12b of the protection film 12 formed in the grooves 23, which are formed in the first dicing film 22 shown in FIG. 12, protrude from the upper surface of the sealing film 10. The protruded parts 12b are removed by polishing, and as shown in FIG. 14, the upper surfaces of the portions of the protection film 12, which are each located between the adjacent chips, are flush with the upper surface of the sealing film 10. The upper surfaces of the columnar electrodes 9 are exposed and the upper parts of the grooves 25 are opened.

Figure 15:
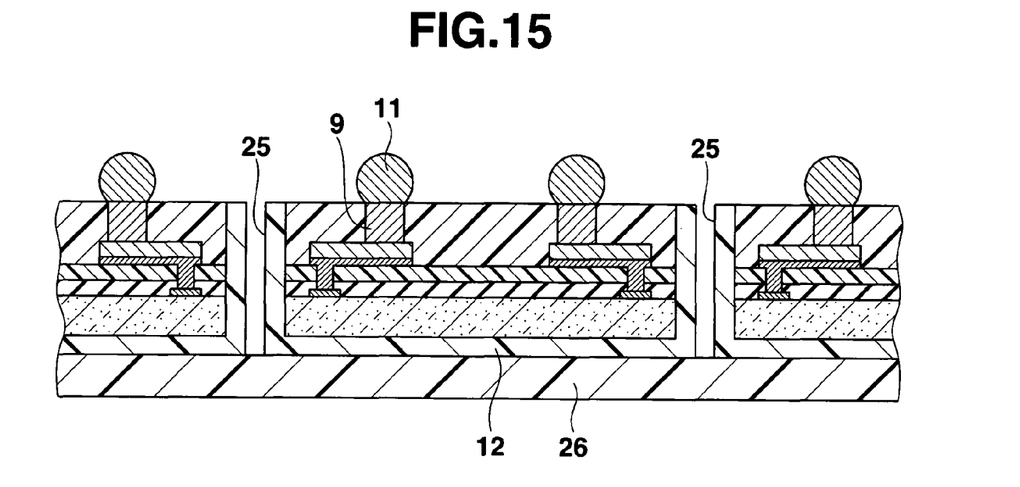
FIG. 15 is a cross sectional view showing the semiconductor substrate for explaining a process step following the process step shown FIG. 14.

Following the above step, as shown in FIG. 15, solder balls 11 are formed on the exposed upper surfaces of the columnar electrodes 9, respectively. In this state, the silicon substrates 1 including the protection films 12 and the like are stacked on one support film 26. However, those substrates are separated as chips by the grooves 25. Then, the silicon substrates 1 including the protection films 12 are peeled off from the support film 26, and the plurality of semiconductor devices shown in FIG. 1 are fabricated.

As seen from the foregoing description, also in the second semiconductor device manufacturing method, the protection film 12 is simultaneously formed on the reverse surface, the peripheral side surface and the like of the silicon substrates 1. The number of the steps to form the protection film 12 is thus reduced when compared to the case using the different protection film forming steps. Further, there is no need of re-arraying the separated silicon substrates 1 and the like. In the semiconductor device manufacturing methods, a normal pressure/temperature CVD process may be used for the formation of the protection film 12.

What is claimed is:

1. A method of manufacturing a semiconductor device comprising:
    stacking a first surface of a wafer-state semiconductor substrate provided with a plurality of external connection electrodes on a first surface of a support film;
    cutting the wafer-state semiconductor substrate stacked on the first surface of the support film into a plurality of chip size semiconductor substrates, wherein chip size semiconductor substrates adjacent to each other are separated from each other, and wherein each of the plurality of chip size semiconductor substrates is provided with at least one of the plurality of external connection electrodes; and
    when said plurality of chip size semiconductor substrates, which are adjacent to each other, are separated from each other, forming at least one protection film: (i) on a second surface of the plurality of the chip size semiconductor substrates, which is opposite to the first surface of the wafer-state semiconductor substrate, and (ii) on a peripheral side surface of each of the plurality of the chip size semiconductor substrates.

2. The method of manufacturing a semiconductor device according to claim 1, further comprising after cutting the wafer-state semiconductor substrate, expanding the support film to increase a distance between said plurality of separated chip size semiconductor substrates that are adjacent to each other.

3. The method of manufacturing a semiconductor device according to claim 1, wherein said at least one protection film is formed in an entire clearance between each of the adjacent ones of the separated chip size semiconductor substrates.

4. The method of manufacturing a semiconductor device according to claim 3, wherein following forming said at least one protection film, said at least one protection film formed between each of the adjacent ones of the separated chip size semiconductor substrates is cut at a center as viewed in a width direction of the plural adjacent chip size semiconductor substrates.

5. The method of manufacturing a semiconductor device according to claim 1, wherein said at least one protection film formed on the peripheral side surfaces of said plurality of chip size semiconductor substrates is separated to thereby form grooves defined by said at least one protection film.

6. The method of manufacturing a semiconductor device according to claim 1, wherein:
    said at least one external connection electrode is a columnar electrode; and
    the method further comprises forming at least one sealing film on and around the columnar electrode before forming said plurality of chip size semiconductor substrates.

7. The method of manufacturing a semiconductor device according to claim 6, wherein forming said plurality of chip size semiconductor substrates includes cutting said at least one sealing film, together with the wafer-state semiconductor substrate, into a plurality of sealing films.

8. The method of manufacturing a semiconductor device according to claim 7, wherein said at least one protection film is formed on peripheral side surfaces of said plurality of separated sealing films and the peripheral side surfaces of said plurality of chip size semiconductor substrates.

9. The method of manufacturing a semiconductor device according to claim 6, wherein at least one recess is formed in the first surface of the support film simultaneously with the cutting of the wafer-state semiconductor substrate, and a thickness of said at least one protection film is equal to or smaller than a depth of said at least one recess.

10. The method of manufacturing a semiconductor device according to claim 6, wherein after said at least one protection film is formed, a solder ball is formed on said each columnar electrode of said plurality of chip size semiconductor substrates.

* * * * *